United States Patent [19]
Nozaki et al.

[11] Patent Number: 6,072,203
[45] Date of Patent: Jun. 6, 2000

[54] SEMICONDUCTOR DEVICE

[75] Inventors: Chiharu Nozaki, Yokohama; Minoru Amano, Funabashi; Yukie Nishikawa, Narashino; Masayuki Sugiura; Takao Noda, both of Yokohama; Aki Sasaki, Koshigaya; Yasuo Ashizawa, Kawasaki, all of Japan

[73] Assignee: Kabushiki Kaisha Toshiba, Kawasaki, Japan

[21] Appl. No.: 09/046,791

[22] Filed: Mar. 24, 1998

[30] Foreign Application Priority Data

Mar. 25, 1997 [JP] Japan .................................. 9-071001

[51] Int. Cl.[7] .............................................. H01L 31/0328
[52] U.S. Cl. .............................. 257/194; 257/94; 257/96; 257/98; 257/280; 257/284; 257/473; 257/486
[58] Field of Search ................................. 257/194, 98, 82, 257/486, 751, 249, 610, 611, 612, 280, 284, 765, 473

[56] References Cited

U.S. PATENT DOCUMENTS

| | | | |
|---|---|---|---|
| 4,586,063 | 4/1986 | Nakamura et al. | 357/22 |
| 4,710,787 | 12/1987 | Usagawa et al. | 357/16 |
| 5,343,057 | 8/1994 | Gerard et al. | 257/192 |
| 5,350,709 | 9/1994 | Harada et al. | 437/161 |
| 5,351,128 | 9/1994 | Goto et al. | 257/192 |
| 5,550,388 | 8/1996 | Haruyama | 257/24 |
| 5,635,735 | 6/1997 | Miyamoto et al. | 257/192 |
| 5,679,982 | 10/1997 | Gardner | 257/758 |
| 5,777,350 | 7/1998 | Nakamura et al. | 257/96 |
| 5,811,843 | 9/1998 | Yamamoto et al. | 257/194 |
| 5,900,647 | 5/1999 | Inoguchi | 257/76 |

FOREIGN PATENT DOCUMENTS 9-92819  4/1997  Japan .

*Primary Examiner*—David B. Hardy
*Assistant Examiner*—Huy Bui
*Attorney, Agent, or Firm*—Oblon, Spivak, McClelland, Maier & Neustadt, P.C.

[57] ABSTRACT

In an HEMT, a channel forming layer is arranged above a semi-insulating substrate via a buffer layer. A spacer layer is arranged on the channel forming layer and an electron supplying layer and a Schottky contact layer are sequentially arranged on the spacer layer. A diffusion preventing layer, for preventing a metal element of a gate electrode from diffusing into the channel forming layer, is arranged in the Schottky contact layer.

20 Claims, 5 Drawing Sheets

SEMICONDUCTOR DEVICE

BACKGROUND OF THE INVENTION

The present invention relates generally to a semiconductor device, and more particularly to a field effect transistor consisting essentially of a Group III–V compound semiconductor.

Conventionally, a high electron mobility transistor (HEMT) is known as a field effect transistor (FET). The HEMT has, on a semi-insulating GaAs substrate, a hetero junction between a non-doped InGaAs channel forming layer and an electron supplying layer consisting essentially of a semiconductor which has a lower electron affinity than that of InGaAs and is doped with an n-type impurity to a high concentration. The HEMT has a high operation speed and a low noise ratio by using as a carrier a two-dimensional electron gas (2DEG) having a high electron mobility formed in the InGaAS channel forming layer of a high purity. In general, AlGaAs, InGaP or InGaAlP is used as a material of the electron supplying layer.

FIG. 2 is a schematic cross-sectional view showing a conventional HEMT having an electron supplying layer made of InGaP. The HEMT is produced in the following process.

First, a non-doped GaAs buffer layer 202, a non-doped InGaAs channel forming layer 203, a non-doped InGaP spacer layer 204, an Si-doped n-type InGaP electron supplying layer 205, a non-doped InGaP Schottky contact layer 206, and an Si-doped n-type GaAs ohmic contact layer 208 are formed in sequence on a semi-insulating GaAs substrate 201 by metal organic chemical vapor deposition (MOCVD).

Then, a resist pattern (not shown) is formed on the GaAs ohmic contact layer 208. A source electrode 209 and a drain electrode 210 are formed through an electrode metal deposition step, a lift-off step and an alloying step.

Further, a resist pattern (not shown) is formed by electron beam exposure so that only a part of the n-type GaAs ohmic contact layer 208 is exposed. Using the resist pattern as a mask, the n-type GaAs ohmic contact layer 208 is removed by etching (recess etching), so that the surface of the non-doped InGaP Schottky contact layer 206 is exposed. A gate electrode 211 is formed on the exposed surface of the Schottky contact layer 206. In general, Ti is used as a material of the gate electrode 211, in consideration of the barrier height between the gate electrode and the InGaP Schottky contact layer 206, leak current or stability.

However, although Ti has a comparatively high melting point, thermal diffusion into InGaP is not avoidable. According to reliability tests, the threshold voltage was varied. It has become clear that these results of the tests are due to the non-uniform diffusion of Ti into an InGaP layer. The electrode can be formed of any metals other than Ti, which have the Schottky characteristic, for example, Mo having a high melting point or Pt. The present inventors manufactured a transistor by way of trial with these metals, but could not find a metal superior to Ti in terms of the initial characteristic and reliability characteristic, since all these metals have problems in barrier height, leak current or stability.

Diffusion of metals other than Ti also causes a considerable problem in the device characteristics like the aforementioned problems of Ti.

As described above, in the conventional HEMT, Ti is generally used in consideration of the barrier height relative to a Schottky contact layer, leak current or stability. However, thermal diffusion of such a metal element into a semiconductor layer is not avoidable. It is known, through reliability tests, etc., that the use of such a metal has a problem of deterioration of the device characteristics (for example, the threshold voltage is varied) and a decrease in planar uniformity.

BRIEF SUMMARY OF THE INVENTION

An object of the present invention is to solve the above problems and provide a semiconductor device having superior device characteristics and planar uniformity as compared to the conventional art.

According to a first aspect of the present invention, there is provided a semiconductor device including a field effect transistor, the transistor comprising:

a semi-insulating semiconductor substrate;

a channel forming layer arranged on or above the substrate;

a Schottky contact layer arranged on or above the channel forming layer;

a gate electrode, consisting essentially of a metal, for constituting a Schottky contact with the Schottky contact layer; and a diffusion preventing layer, arranged to intervene between the channel forming layer and the gate electrode and in contact with the Schottky contact layer, for preventing the metal of the gate electrode from diffusing into the channel forming layer.

According to a second aspect of the present invention, there is provided a semiconductor device including a photo-semiconductor element, the photo-semiconductor element comprising:

a supporting substrate;

first and second current injection layers of first and second conductivity types arranged on or above the supporting substrate;

an active layer sandwiched between the first and second current injection layers;

first and second contact layers of first and second conductivity types respectively connected to the first and second current injection layers;

first and second main electrodes, consisting essentially of metals, for constituting ohmic contact with the first and second contact layers, respectively; and a first diffusion preventing layer, arranged to intervene between the active layer and the first main electrode, for preventing the metal of the first main electrode from diffusing into the active layer.

According to a third aspect of the present invention, there is provided a semiconductor device including a field effect transistor, the transistor comprising:

a semi-insulating semiconductor substrate;

a channel forming layer arranged on or above the substrate;

a Schottky contact layer arranged on or above the channel forming layer;

a gate electrode, consisting essentially of a metal, for constituting a Schottky contact with the Schottky contact layer; and a layer including an electrode material, arranged to intervene between the channel forming layer and the gate electrode and in contact with the Schottky contact layer.

According to a fourth aspect of the present invention, there is provided a semiconductor device comprising:

a supporting substrate;

a multi-layered structure consisting essentially of Group III–V compound semiconductors and arranged on the supporting substrate;

a contact layer consisting essentially of a Group III–V compound semiconductor and arranged on the multi-layered structure;

an electrode made of a metal and arranged on the contact layer; and a diffusion preventing layer, arranged to intervene between the multi-layered structure and the electrode and in contact with the contact layer, for preventing the metal of the electrode from diffusing into the multi-layered structure, the diffusion preventing layer consisting essentially of a Group III–V compound semiconductor including an electrode material.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION (First Embodiment)

In the following description of a first embodiment, an FET has a Schottky contact layer consisting essentially of InGaP and a gate electrode consisting essentially of Ti.

The present inventors studied thermal diffusion of Ti in various materials of Group III–V compound semiconductors including InGaP, which forms the Schottky contact layer. The evaluation of thermal diffusion was analyzed by RBS (Rutherford back scattering) method on the basis of diffusion profiles of the metals and lattice-disorder of the semiconductors on the interface between Ti and the semiconductors.

Figure 3A:
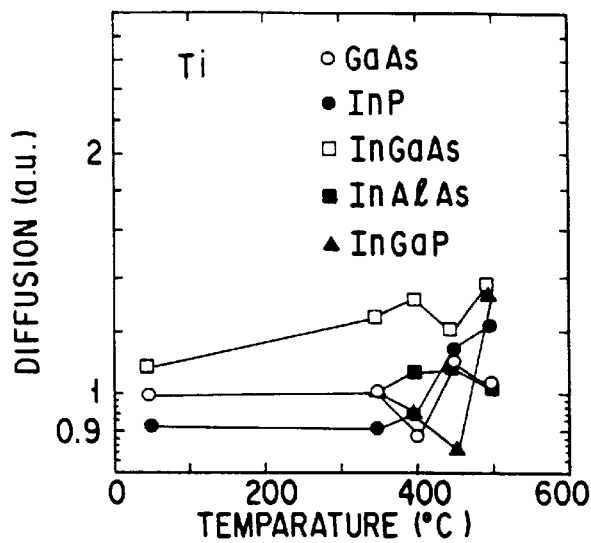
FIGS. 3A to 3C are characteristic diagrams showing conventional problems of diffusion.
Figure 3B:
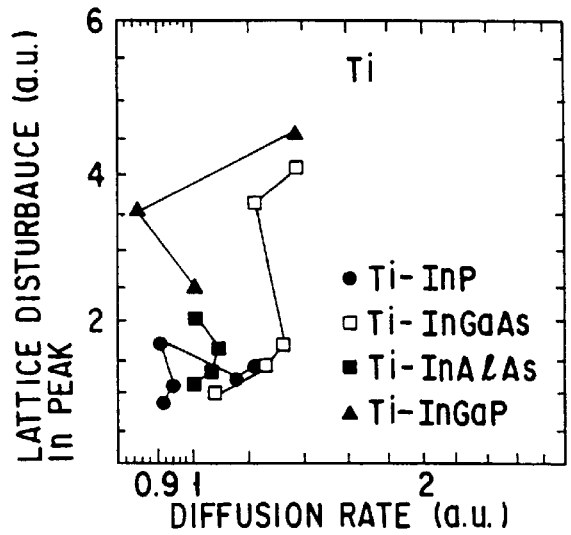
Figure 3C:
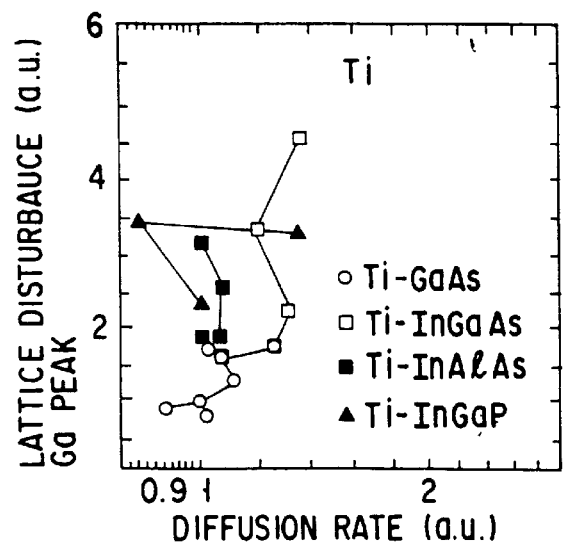

As a result, it has been found that the diffusion mechanism of Ti varies depending on the kind of the semiconductor connected thereto, and that the materials in which Ti diffuses greatly have some tendencies in respect of the component elements. More specifically, as shown in FIGS. 3A to 3C, the following matters have been discovered.

First, the greater the number of elements forming the semiconductor layer, the easier Ti is diffused in the layer; that is, the diffusion occurs more easily in an multi-element system, e.g., in a ternary system than in a binary system. For example, Ti is diffused more easily in InGaP, InGaAs or InAlAs as compared to GaAs or InP. Secondly, as regards the Group III elements used in the semiconductor layer, the lattice disturbance in the interface with Ti is greater in the case of In or Ga than in the case of Al. As regards the Group V elements, the lattice disturbance in the interface with Ti is greater in the case of P than in the case of As. As the lattice disturbance in the interface with Ti is greater, the mobility is much lower.

In view of these facts, Ti is diffused most easily in an InGaP layer of all the combinations of the Group III and V elements of the Group III–V compounds. Further, it has been discovered that when an AlAs layer, which is considered to be a combination wherein Ti can be present most stably, is inserted into a portion of an InGaP layer as a diffusion preventing layer (diffusion stopper layer), the diffusion of Ti is inhibited uniformly at that portion. The diffusion preventing layer contains an electrode material, such as Ti. According to the present invention, the diffusion preventing layer has a smaller coefficient of diffusion with respect to a subject metal as compared to a semiconductor layer adjacent thereto.

Since an InGaP Schottky contact layer and an AlAs layer are lattice-matching, new causes for characteristic deterioration, such as generation of defects, are not created by insertion of the AlAs layer. Further, it is known that there is no problem in the Schottky junction between AlAs and InGaP.

Figure 1:
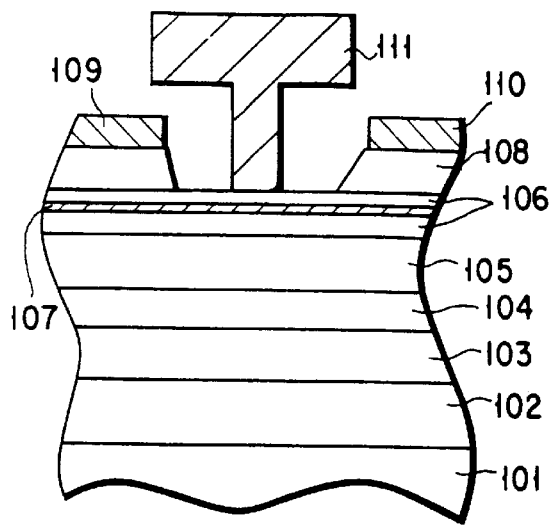
FIG. 1 is a schematic cross-sectional view of a semiconductor device according to first and second embodiments of the present invention.
Figure 2:
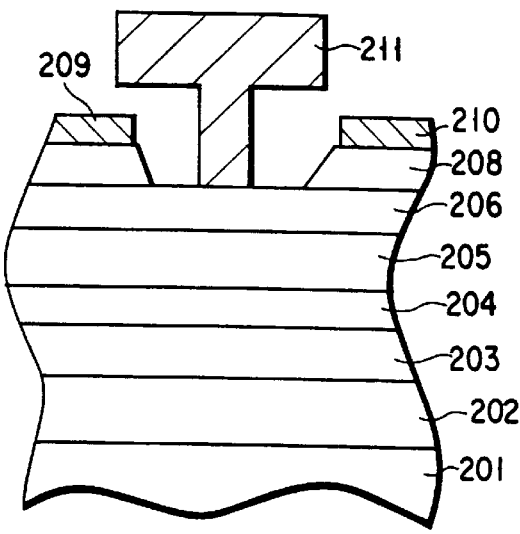
FIG. 2 is a schematic cross-sectional view of a conventional semiconductor device.

A method for producing the HEMT of the present invention, having the aforementioned diffusion stopper layer, will now be described. FIG. 1 is a schematic cross-sectional view according to the first embodiment of the present invention.

First, the following layers are sequentially formed on a semi-insulating GaAs substrate 101 formed by the MOCVD: a non-doped GaAs or AlGaAs buffer layer 102, a non-doped or n-type InGaAs channel forming layer 103, a non-doped InGaP spacer layer 104, an Si-doped n-type InGaP electron supplying layer 105, a non-doped or n-type InGaP Schottky contact layer 106, a non-doped AlAs diffusion stopper layer 107, a non-doped or n-type InGaP Schottky contact layer 106 and an Si-doped n-type GaAs ohmic contact layer 108.

Then, a resist pattern (not shown) is formed on the GaAs ohmic contact layer 108. A source electrode 109 and a drain electrode 110 are formed through an electrode metal deposition step, a lift-off step and an alloying step.

Further, a resist pattern (not shown) is formed by electron beam exposure so that only a part of the n-type GaAs ohmic contact layer 108 is exposed. Using the resist pattern as a mask, the n-type GaAs ohmic contact layer 108 is removed by etching (recess etching), so that the surface of the non-doped InGaP Schottky contact layer 106 is exposed. A gate electrode 111 having a laminated structure, which consists of Ti/Pt/Au from the bottom, is formed on the exposed surface of the Schottky contact layer 106.

In this embodiment, the non-doped AlAs diffusion stopper layer 107 has a function of suppressing the diffusion of the metal material of the gate electrode 111. The Schottky contact with InGaP is not deteriorated by the insertion of the diffusion stopper layer 107.

The diffusion stopper layer 107 may be formed in the lowermost portion of the Schottky contact layers, not between the Schottky contact layers 106.

(Second Embodiment)

The second embodiment relates to an InGaP HEMT, having substantially the same cross section as that of the first embodiment shown in FIG. 1. Therefore, the second embodiment will be described with reference to FIG. 1.

In the HEMT of this embodiment, the following layers are sequentially formed on a semi-insulating GaAs substrate 101: a non-doped GaAs buffer layer 102 having a thickness of 800 nm, a non-doped $In_{0.2}Ga_{0.8}As$ channel forming layer 103 having a thickness of 12 nm, a non-doped $In_{0.48}Ga_{0.52}P$ spacer layer 104 having a thickness of 3 nm, an Si-doped n-type $In_{0.48}Ga_{0.52}P$ electron supplying layer 105 having a thickness of 10 nm and a donor concentration of $Nd=5\times10^{18}$ $cm^{-3}$, and a non-doped $In_{0.48}Ga_{0.52}P$ Schottky contact layer having a thickness of 10 nm (corresponding to the layer 106). A non-doped AlAs diffusion stopper layer 107 having a thickness of several monolayers is formed in a portion of a depth of 2 nm below the upper surface of the Schottky contact layer 106. An Si-doped n-type GaAs ohmic contact layer 108 having a thickness of 20 nm and a donor concentration of $Nd=5\times10^{18}$ $cm^{-3}$ is formed on the Schottky contact layer 106. Source and drain electrodes 109 and 110 are formed of AuGe. A gate electrode 111 has a laminated structure consisting of Ti (20 nm)/Pt (30 nm)/Au (150 nm) from the bottom.

In this embodiment, the non-doped InGaP Schottky contact layer 106 functions as an etching stopper, when the Si-doped n-type GaAs ohmic contact layer 108 is etched. Therefore, the portion of the Schottky contact layer 106 of the depth of at least 2 nm below the upper surface of the layer 106 must consist essentially of InGaP.

The non-doped AlAs diffusion stopper layer 107 as thin as several monolayers can suppress the diffusion of Ti substantially completely, and provide satisfactory Schottky characteristic between Ti and InGaP.

In the HEMT of this embodiment, the threshold voltage was controlled more easily as compared to the conventional HEMT. The planar uniformity of the device was also improved, resulting in improvement of the device characteristics.

(Third Embodiment)

Figure 4:
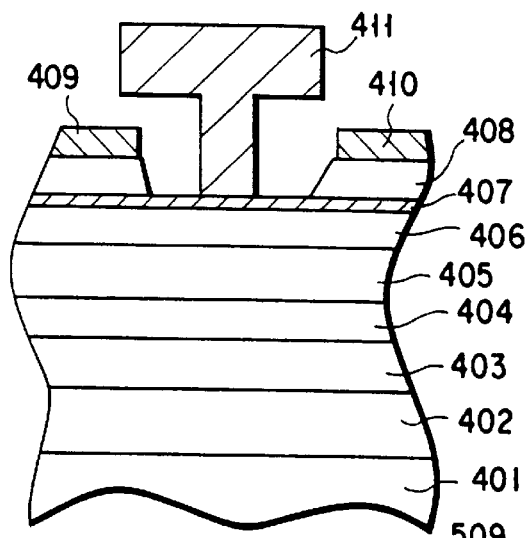
FIG. 4 is a schematic cross-sectional view of a semiconductor device according to a third embodiment of the present invention.

FIG. 4 is a schematic cross-sectional view of a semiconductor device according to a third embodiment of the present invention.

In the HEMT of this embodiment, the following layers are sequentially formed on a semi-insulating InP substrate 401: a non-doped InP buffer layer 402 having a thickness of 800 nm, a non-doped $In_{0.48}Ga_{0.52}As$ channel forming layer 403 having a thickness of 12 nm, a non-doped $In_{0.48}Al_{0.52}As$ spacer layer 404 having a thickness of 3 nm, an Si-doped n-type $In_{0.48}Al_{0.52}As$ electron supplying layer 405 having a thickness of 10 nm and a donor concentration of $Nd=5\times10^{18}$ $cm^{-3}$, and a non-doped $In_{0.48}Al_{0.52}As$ Schottky contact layer having a thickness of 10 nm (corresponding to the layer 406). A non-doped AlAs diffusion stopper layer 407 having a thickness of 3 monolayers is formed in an uppermost portion of the Schottky contact layer 406. Further, an Si-doped n-type GaAs ohmic contact layer 408 having a thickness of 20 nm and a donor concentration of $Nd=5\times10^{18}$ $cm^{-3}$ is formed on the diffusion stopper layer 407. Source and drain electrodes 409 and 410 are formed of AuGe, and a gate electrode 411 is formed of Ti.

In the case of InP HEMT, since the Schottky contact layer 406 does not function as an etching stopper layer by nature, the AlAs diffusion stopper layer 407 can be inserted in the uppermost portion of the Schottky contact layer 406. However, since the $In_{0.48}Al_{0.52}As$ Schottky contact layer 406 are not lattice-matching with the AlAs layer 407, the thickness of the diffusion stopper layer is determined to be 3 monolayers, which is a thickness sufficient to suppress diffusion but does not cause defects.

According to this embodiment, the non-doped AlAs diffusion stopper layer 407 as thin as several monolayers can suppress the diffusion of Ti substantially completely, and provide satisfactory Schottky characteristic between Ti and InAlAs.

In the HEMT of this embodiment, the threshold voltage was controlled more easily as compared to the conventional HEMT. The planar uniformity of the device was also improved, resulting in improvement of the device characteristics.

(Fourth Embodiment)

Figure 5:
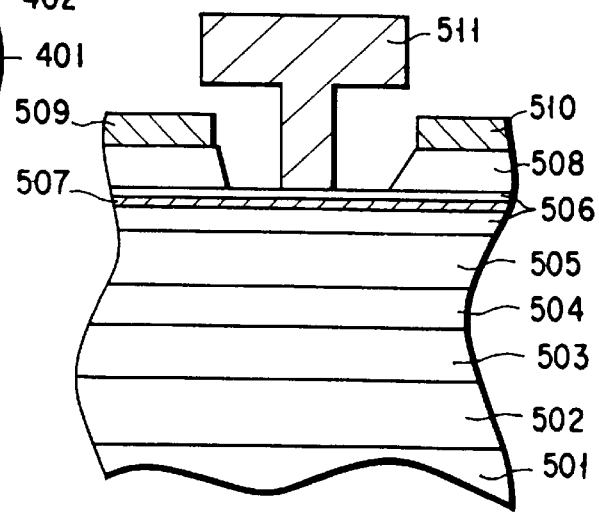
FIG. 5 is a schematic cross-sectional view of a semiconductor device according to a fourth embodiment of the present invention.

FIG. 5 is a schematic cross-sectional view of an InGaP-InP HEMT semiconductor device having a distortion Schottky contact according to a fourth embodiment of the present invention.

In the HEMT of this embodiment, the following layers are sequentially formed on a semi-insulating InP substrate 501: a non-doped InP buffer layer 502 having a thickness of 800 nm, a non-doped $In_{0.48}Ga_{0.52}As$ channel forming layer 503 having a thickness of 12 nm, a non-doped $In_{0.48}Al_{0.52}As$ spacer layer 504 having a thickness of 3 nm, an Si-doped n-type $In_{0.48}Al_{0.52}As$ electron supplying layer 505 having a thickness of 10 nm and a donor concentration of $Nd=5\times10^{18}$ $cm^{-3}$, and a non-doped $In_{0.48}Ga_{0.52}P$ Schottky contact layer having a thickness of 10 nm (corresponding to the layer 506). A non-doped AlAs diffusion stopper layer 507 having a thickness of 3 monolayers is formed in a middle portion of the Schottky contact layer 506. Further, an Si-doped n-type GaAs ohmic contact layer 508 having a thickness of 20 nm and a donor concentration of $Nd=5\times10^{18}$ $cm^{-3}$ is formed on the Schottky contact layer 506. Source and drain electrodes 509 and 510 are formed of AuGe, and a gate electrode 511 is formed of Ti.

The HEMT having the pseudomorphic InGaP-InP Schottky contact is advantageous in that the gate breakdown voltage is higher than that of the normal InP structure. However, since the InGaP material is in contact with the gate electrode, the gate electrode metal (e.g., Ti) is easily diffused, which causes deterioration or variance of the characteristics. According to this embodiment, the deterioration is prevented and the variance is reduced by inserting the AlAs layer 507 of 3 monolayers, serving as a diffusion stopper layer, into a middle portion of the InGaP contact layer.

In this embodiment, the non-doped InGaP Schottky contact layer 506 functions as an etching stopper, when the Si-doped n-type GaAs ohmic contact layer 508 is etched. Therefore, the portion of the Schottky contact layer 506 of the depth of at least 2 nm below the upper surface of the layer 506 must consist essentially of InGaP.

The non-doped AlAs diffusion stopper layer 507 as thin as several monolayers can suppress the diffusion of Ti substantially completely, and satisfactorily provide the Schottky characteristic between Ti and InGaP.

In the HEMT of this embodiment, the threshold voltage was controlled more easily as compared to the conventional HEMT. The planar uniformity of the device was also improved, resulting in improvement of the device characteristics.

The present invention is not limited to the first to fourth embodiments described above, but can be modified variously within the scope of the gist of the present invention. For example, the material of the gate electrode of the FET may be a metal or an alloy other than Ti. In the FET, a semiconductor layer for suppressing diffusion of the material is inserted in a suitable position (for example, the overall surface of the substrate, or a limited region under the gate electrode) as a diffusion stopper layer, thereby controlling the characteristics or reducing the variance of the characteristics. Moreover, the present invention can be applied to various semiconductor device having a Schottky electrode.

(Fifth Embodiment)

Figure 6:
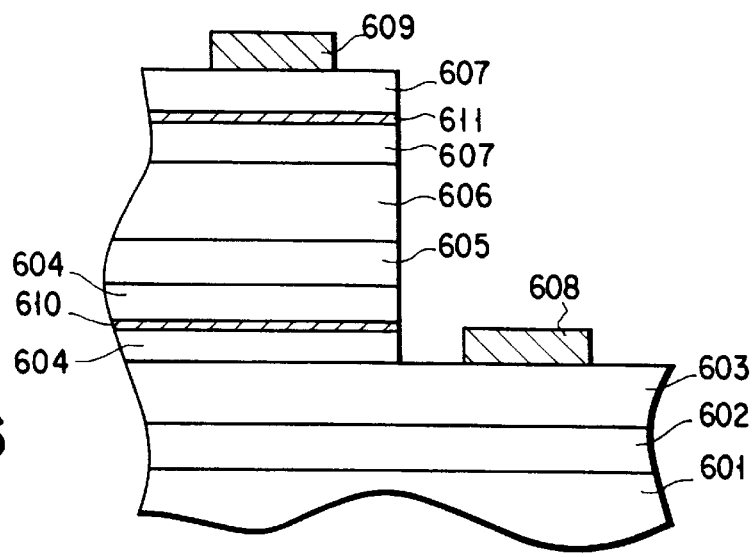
FIG. 6 is a schematic cross-sectional view of a semiconductor device according to a fifth embodiment of the present invention.

FIG. 6 is a schematic cross-sectional view of a GaN laser diode (LD) according to a fifth embodiment of the present invention.

In the LD, the following layers are sequentially formed on a sapphire substrate 601: a GaN buffer layer 602, an Si-doped n-type GaN contact layer 603 (a donor concentration $Nd=1\times10^{19}$ cm$^{-3}$), an Si-doped n-type $Al_{0.2}Ga_{0.8}N$ clad layer (current injection layer) 604 (a donor concentration $Nd=1\times10^{18}$ cm$^{-3}$), a $GaN/In_{0.2}Ga_{0.8}N$ super-lattice active layer 605, an Mg-doped p-type $Al_{0.2}Ga_{0.8}N$ clad layer (current injection layer) 606 (an acceptor concentration $Na=1\times10^{18}$ cm$^{-3}$), and an Mg-doped p-type GaN contact layer 607 (an acceptor concentration $Na=1\times10^{18}$ cm$^{-3}$). An n-side ohmic contact electrode Ti/Au 608 is formed on the n-type GaN contact layer 603 alongside the n-type $Al_{0.2}Ga_{0.8}N$ clad layer 604. A p-side ohmic contact electrode Pt/Au 609 is formed on the p-type GaN contact layer 607.

When metal atoms forming the n-side or p-side contact electrode reach the active layer 605 or partially diffuse into the contact layer 607 and the clad layer 604 or 606, the device characteristics are varied or deteriorated. To prevent this, AlN layers 610 and 611 of several monolayers, serving as diffusion stopper layers against Ti and Pt, are respectively inserted in the n-type $Al_{0.2}Ga_{0.8}N$ clad layer 604 and the p-type GaN contact layer 607.

With this structure, the diffusion of the metals (Ti and Pt) forming the electrodes in the n-type $Al_{0.2}Ga_{0.8}N$ clad layer 604 and the p-type GaN contact layer 607 is stopped by the stopper layers, thereby preventing further diffusion or diffusion concentration. Although the AlN layer 610 is inserted in the n-type $Al_{0.2}Ga_{0.8}N$ clad layer in the device of this embodiment, the n-type clad layer is not limited to this constitution. Hardly any problem is caused in characteristic, so long as the AlN layer 610 is formed in an n-type clad layer.

(Sixth Embodiment)

Figure 7:
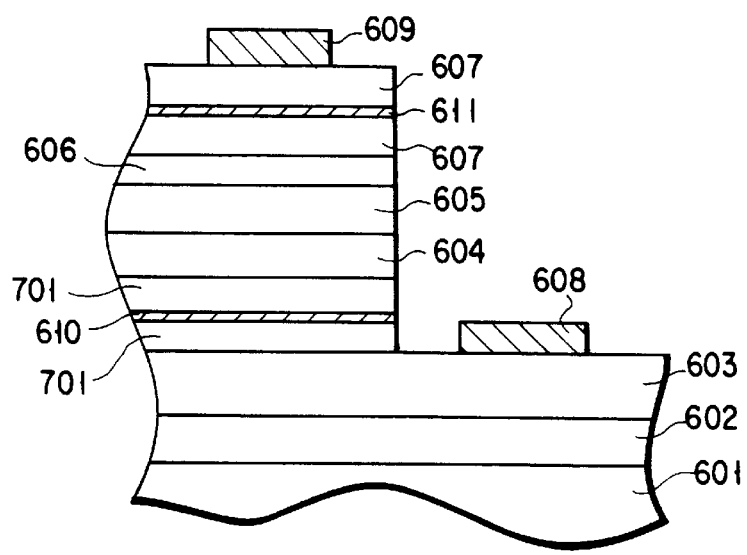
FIG. 7 is a schematic cross-sectional view of a semiconductor device according to a sixth embodiment of the present invention.

FIG. 7 is a schematic cross-sectional view of a GaN laser diode (LD) according to a sixth embodiment of the present invention.

The device of this embodiment is different from that of the fifth embodiment only in that an n-type GaN contact layer 701 is formed on an n-type GaN contact layer 603 and under an n-type $Al_{0.2}Ga_{0.8}N$ clad layer 604, alongside an n-side ohmic contact electrode Ti/Au 608, and that an AlN layer 610 is inserted in the n-type GaN contact layer 701. With this structure, the diffusion of the metals forming the electrodes (Ti and Pt) can be prevented more effectively, although the number of contact layers is increased and the structure is a little more complicated as compared to the fifth embodiment.

(Seventh Embodiment)

As described before, a high electron mobility transistor (HEMT) is a transistor having a two-dimensional electron gas layer, serving as a channel, formed in an electron transit layer (channel forming layer). Conventionally, the source and drain electrodes for inputting/outputting electrons into/from the channel are either alloy electrodes or non-alloy electrodes. An alloy electrode is provided with a contact with a semiconductor layer by forming an alloyed layer in the semiconductor layer. A non-alloy electrode, which is made of a refractory metal, is provided with a contact with a semiconductor layer without forming an alloyed layer. Whether the alloy or non-alloy electrodes are used, both the source and drain electrodes are made of the same material and formed in the same step. As a result, used combinations of the source and drain electrodes are only "alloy and alloy" or "non-alloy and non-alloy".

Figure 11:
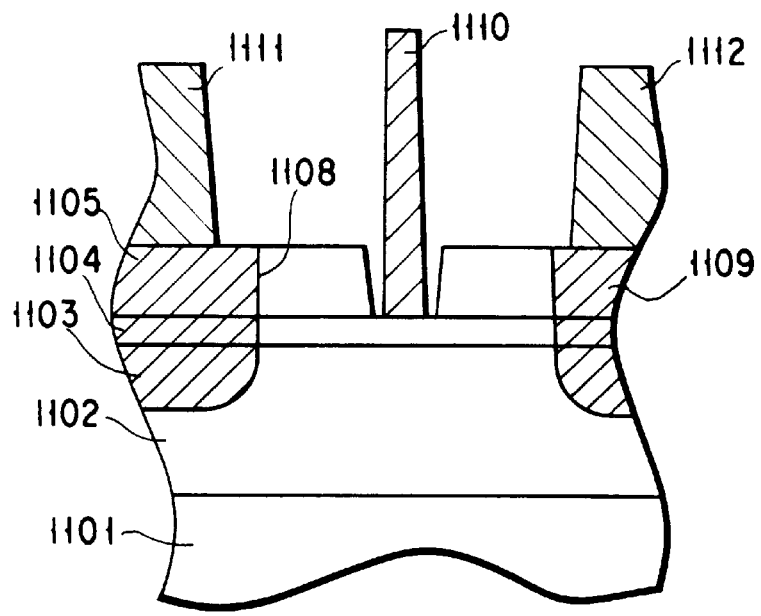
FIG. 11 is a schematic cross-sectional view of another conventional semiconductor device.

FIG. 11 is a schematic cross-sectional view of a conventional HEMT in which the source and drain electrodes are alloy electrodes.

Alloy electrodes 1108 and 1109 are formed by depositing AuGe/Ni/Au layers or AuGe/Ni layers by means of vacuum deposition and then heat-treating the layers. In this case, the electrical characteristic of the contact between the metal and the semiconductor is very good: the contact resistance can be as low as 0.01 Ω·mm order. As described in Jpn. Pat. Appln. KOKOKU Publication No. 3-25932, the reason why such a good electrical characteristic is obtained is that an alloyed layer is formed so as to have a thickness the same as that of the deposited metal layer and the metal is brought into direct contact with the two-dimensional electron gas layer.

In FIG. 11, a reference numeral 1101 denotes a GaAs semi-insulating substrate, 1102 a GaAs buffer layer, 1103 a non-doped InGaAs channel layer, 1104 an n-type AlGaAs electron supplying layer, 1105 an n-type GaAs contact layer, 1110 a gate electrode, 1111 a source electrode, and 1112 a drain electrode.

An alloyed layer is formed so as to expand isotropically from the lower surface of the deposited electrode metal layer. Therefore, if the element is designed to have a small distance between the source and gate electrodes or the gate and drain electrodes in order to reduce the parasitic resistance component of the transistor, i.e., the source and drain resistances, the distance between the electrodes is much smaller due to the formation of the alloyed layer. As a result, the breakdown voltage is lowered, and in the worst case, a short-circuit defect may occur. If the distance between the electrodes is small, the presence of an alloyed layer may lower the reliability.

Figure 12:
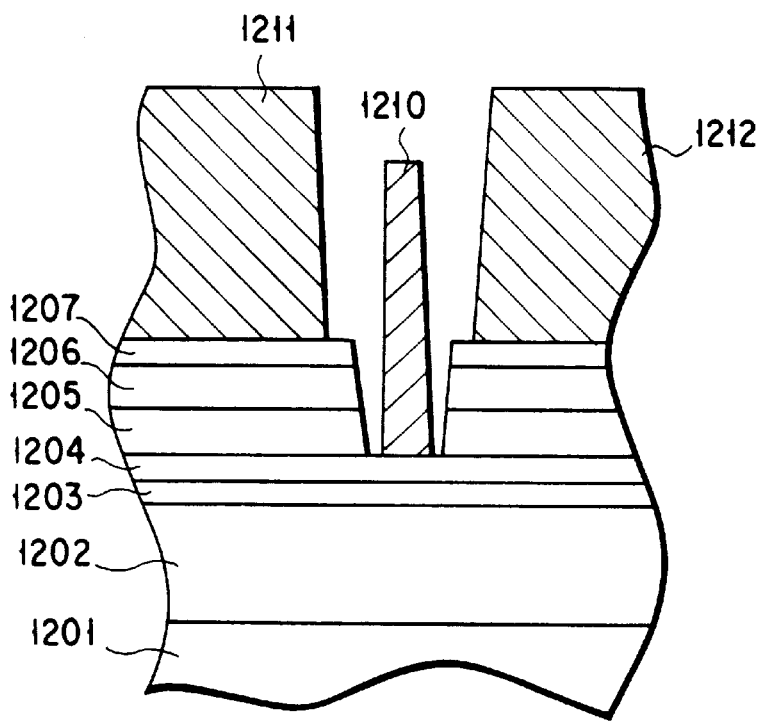
FIG. 12 is a schematic cross-sectional view of still another conventional semiconductor device.

FIG. 12 is a schematic cross-sectional view of a conventional HEMT in which the source and drain electrodes are non-alloy electrodes.

Source and drain electrodes 1211 and 1212 are non-alloy electrodes made of a refractory metal. Without forming an alloyed layer, the source and drain electrodes 1211 and 1212 constitute direct ohmic contact to an InGaAs contact layer 1207, which is formed as an uppermost layer of the contact layers and in which an n-type impurity is introduced to a high concentration. Since an alloyed layer is not formed, the aforementioned problems in the case of the alloy electrodes, i.e., the low breakdown voltage and the inferior reliability, can be prevented, while the distances between the source and gate electrodes and the gate and drain electrodes can be smaller.

However, unlike the alloy electrode directly in contact with the two-dimensional electron layer by means of the alloyed layer, the contact between the non-alloy electrode and the two-dimensional electron layer requires the following contact layers 1207 to 1204 therebetween: an n-type InGaAs contact layer 1207 connected to the metal of the non-alloy electrode, an n-graded InGaAs contact layer 1206, an n-type GaAs contact layer 1205 and an n-type AlGaAs electron supplying layer 1204. In the layer 1206, the concentration of In is gradually increased from the n-type GaAs contact layer 1205 toward the n-type InGaAs contact layer 1207.

Since the electron supplying layer consists of a material having an electron affinity lower than that of InGaAs forming the contact layer, it serves as a barrier against electrons. Therefore, the resistance of the contact between the metal and the semiconductor is as high as 0.1 Ω·mm order, about ten times the resistance of the contact in the case of an alloy electrode.

In FIG. 12, a reference numeral 1201 denotes a GaAs semi-insulating substrate, 1202 a GaAs buffer layer, 1203 a non-doped InGaAs channel layer, 1210 a gate electrode, 1211 a source electrode, and 1212 a drain electrode.

In this embodiment having the above structure, to realize source and drain resistances equivalent to those in the case of the alloy electrode, the distance between the source and gate electrodes and the distance between the gate and drain electrodes should be reduced to such an extent that the source and drain resistances are determined essentially only by the contact resistance components. However, in this case, a sufficient breakdown voltage cannot be obtained between the gate ad drain electrodes, in particular. In addition, since the parasitic capacitance formed in a space between the gate and drain electrodes is increased, which increases the feedback capacitance, hardly any gain can be obtained at a high frequency.

To solve the above problems, according to the present invention, there is provided a semiconductor device, such as an HEMT, wherein the source electrode is a non-alloy electrode made of a metal having a high melting point, and the drain electrode is an alloy electrode made of an alloy of a metal and a semiconductor of the substrate under the electrode.

With this structure, since the source electrode is formed of non-alloy, the reliability of the source electrode is fully maintained. Further, since there is a potential difference of 0 to at most about 2 volt between the source and gate electrodes, the breakdown voltage between the source and drain electrodes need not be very high. For this reason, the distance between the source and gate electrodes can be as small as possible, to such an extent that the contact resistance component of the non-alloy electrode essentially mainly determines the parasitic resistance, thereby suppressing the parasitic resistance.

On the other hand, since the drain electrode is an alloy electrode, the contact resistance can be suppressed to a small value. This means that the distance between the source and drain electrodes can be large enough to maintain the breakdown voltage against a high potential difference between the gate and drain electrodes. It also means that the alloy electrode is fully separated from the gate electrode. As a result, the reduction of the reliability due to an expansion of the alloyed layer is negligible.

As described before, the alloyed layer expands to substantially the same thickness as the metal layer which forms the electrode. Therefore, if the distance between the gate and drain electrodes is the same as or greater than the thickness of the metal layer, the problem of the reliability can be avoided. It is preferable that the thickness of the metal layer constituting the electrode be the same or greater than the distance between the two dimensional electron gas layer and the surface of the semiconductor layer.

Further, since the drain electrode is formed of alloy, the n-type InGaAs layer used as the uppermost layer of the contact layers is not particularly necessary in a portion between the gate and drain electrodes. For this reason, if the InGaAs layer of that portion is removed in advance, the area of the end face of the recess-etched layer can be reduced in the drain side. As a result, the breakdown voltage can be further improved and the feedback capacitance can be reduced.

An embodiment of the invention as described above will now be described.

Figure 8:
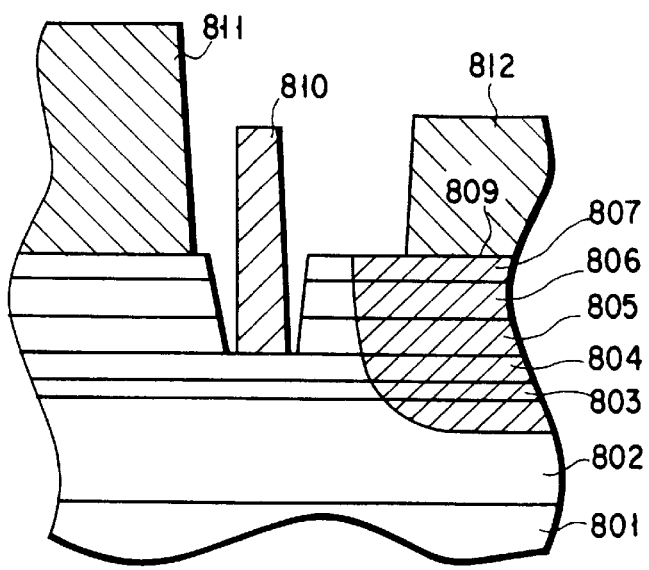
FIG. 8 is a schematic cross-sectional view of a semiconductor device according to a seventh embodiment of the present invention.

FIG. 8 is a schematic cross-sectional view of a semiconductor device according to a seventh embodiment of the present invention.

On a semi-insulating GaAs substrate 801, the following layers are sequentially formed by MOCVD: a GaAs buffer layer 802 having a thickness of 500 nm, an $In_{0.2}Ga_{0.8}As$ electron transit layer 803 having a thickness of 20 nm, an electron supplying n-type $Al_{0.2}Ga_{0.8}As$ layer 804 having a thickness of 30 nm and a carrier concentration $n=3\times10^{18}$ cm$^{-3}$, an n-type GaAs contact layer 805 having a thickness of 30 nm and a carrier concentration of $n=5\times10^{18}$ cm$^{-3}$, an n-type $In_xGa_{1-x}As$ (x is gradually increased from 0 to 0.5) contact layer 806, serving as an n-graded InGaAs contact layer, having a thickness of 30 nm and a carrier concentration $n=1\times10^{19}$ cm$^{-3}$, and an $In_{0.5}Ga_{0.5}As$ contact layer 807 having a thickness of 20 nm and a carrier concentration $n=2\times10^{19}$ cm$^{-3}$.

A source electrode 811 and a gate electrode 810 are made of 500 nm thick Ti/Pt/Au metal layers deposited by vacuum deposition. The gate electrode 810 is formed on the electron supplying AlGaAs layer 804 by forming a pattern by photolithography and thereafter forming a gate recess structure by wet-etching.

The distance between the source and gate electrodes is set to 0.4 μm. Thus, reduction of the source resistance is realized by this embodiment. However, since the distance between the electrodes is small, there is a possibility of increase in gate-source capacitance. Actually, however, since a capacitance between the gate electrode and the two-dimensional electron gas layer is predominant, the parasitic capacitance generated by the external structure is negligible.

To form a drain electrode 809, an AuGe/Ni/Au layer 812 having a thickness of 300 nm is formed by vacuum deposition on the InGaAs layer 807 at a position about 1 μm separated from the gate electrode. Thereafter, the AuGe/Ni/Au layer 812 is heat-treated at a predetermined temperature in a lamp anneal furnace, thereby forming an alloyed layer serving as the drain electrode 809. In this embodiment, the distance between the gate and drain electrodes is 1 μm, which is greater than the thickness of the metal layer. However, as described before, the distance can be smaller, in which case the drain electrode can be lowered, and a high performance can be obtained.

(Eighth Embodiment)

Figure 9:
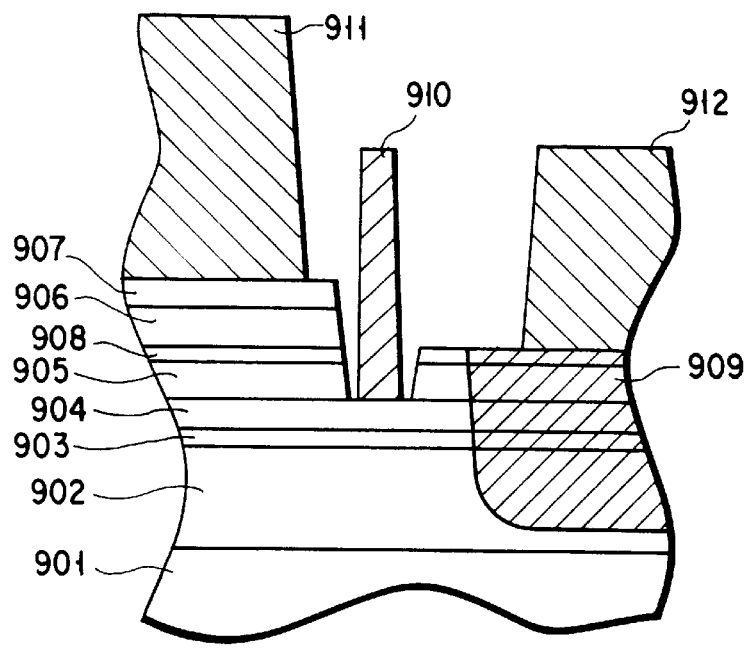
FIG. 9 is a schematic cross-sectional view of a semiconductor device according to an eighth embodiment of the present invention.

FIG. 9 is a schematic cross-sectional view of a semiconductor device according to an eighth embodiment of the present invention.

On a semi-insulating GaAs substrate 901, the following layers are sequentially formed by MOCVD: a GaAs buffer layer 902 having a thickness of 500 nm, an $In_{0.2}Ga_{0.8}As$ electron transit layer 903 having a thickness of 15 nm, an electron supplying n-type $Al_{0.2}Ga_{0.8}As$ layer 904 having a thickness of 20 nm and a carrier concentration $n=3\times10^{18}$ $cm^{-3}$, an n-type GaAs contact layer 905 having a thickness of 30 nm and a carrier concentration of $n=5\times10^{18}$ $cm^{-3}$, an $In_{0.5}Ga_{0.5}P$ etching stopper layer 908 having a thickness of 30 nm and a carrier concentration $n=3\times10^{18}$ $cm^{-3}$, an n-type $In_XGa_{1-X}As$ (x is gradually increased from 0 to 0.5) contact layer 906, serving as an n-graded InGaAs contact layer, having a thickness of 30 nm and a carrier concentration $n=1\times10^{19}$ $cm^{-3}$, and an $In_{0.5}Ga_{0.5}As$ contact layer 907 having a thickness of 20 nm and a carrier concentration $n=2\times10^{19}$ $cm^{-3}$.

The InGaAs layers 906 and 907 formed in an upper portion of the contact layers are removed by etching, before an alloy electrode, to be a drain electrode 909, is formed. As a result, the area of the end face of the recess structure can be reduced in the drain side, the breakdown voltage can be further improved and the feedback capacitance can be reduced. Since an etching solution containing phosphoric acid is used to etch the InGaAs layers 906 and 907, the InGaP layer 908 serves as an etching stopper, the process of high reproducibility can be realized.

A source electrode 911 and a gate electrode 910 are formed of Ti/Pt/Au metal layers. The gate electrode 910 is provided in a recess structure formed by wet etching and in contact with the AlGaAs layer 904. To form a drain electrode 909, an AuGe/Ni/Au layer 912 is formed and then heat-treated at a predetermined temperature in a lamp anneal furnace, thereby forming an alloyed layer serving as the drain electrode 909. As in the seventh embodiment, the distances between the source and gate electrodes and between the gate and drain electrodes are set to 0.4 $\mu$m and 1 $\mu$m, respectively.

(Ninth Embodiment)

Figure 10:
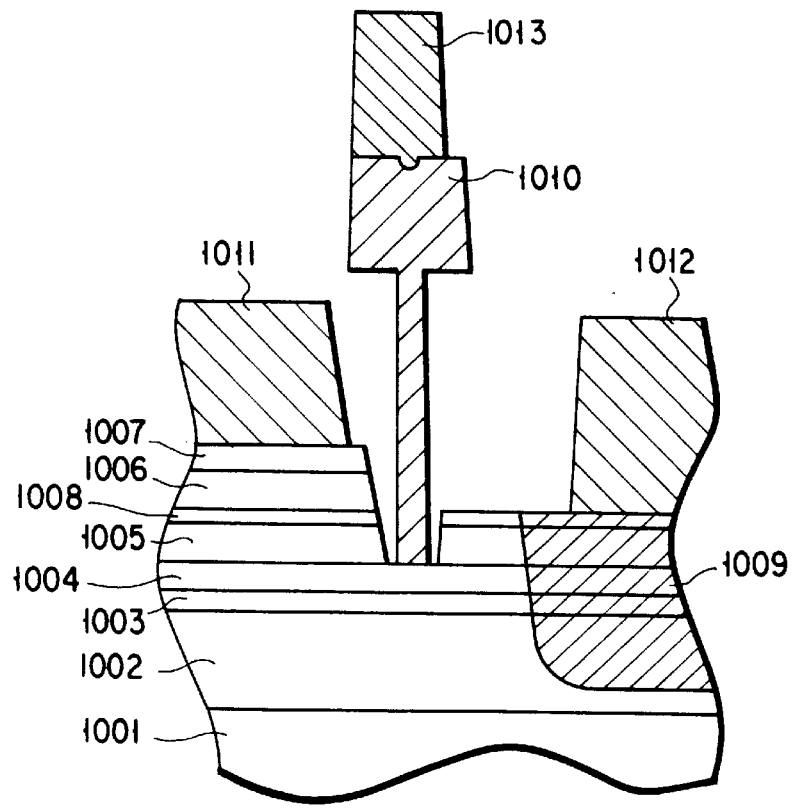
FIG. 10 is a schematic cross-sectional view of a semiconductor device according to a ninth embodiment of the present invention.

FIG. 10 is a schematic cross-sectional view of a semiconductor device according to a ninth embodiment of the present invention. The ninth embodiment differs from the embodiment shown in FIG. 9 only in that a gate electrode having a T-shaped cross section is used.

On a semi-insulating GaAs substrate 1001, the following layers are sequentially formed by MOCVD: a GaAs buffer layer 1002 having a thickness of 500 nm, an $In_{0.2}Ga_{0.8}As$ electron transit layer 1003 having a thickness of 15 nm, an electron supplying n-type $Al_{0.2}Ga_{0.8}As$ layer 1004 having a thickness of 20 nm and a carrier concentration $n=3\times10^{18}$ $cm^{-3}$, an n-type GaAs contact layer 1005 having a thickness of 30 nm and a carrier concentration of $n=5\times10^{18}$ $cm^{-3}$, an $In_{0.5}Ga_{0.5}P$ etching stopper layer 1008 having a thickness of 30 nm and a carrier concentration $n=3\times10^{18}$ $cm^{-3}$, an n-type $In_XGa_{1-X}As$ (x is gradually increased from 0 to 0.5) contact layer 1006, serving as an n-graded InGaAs contact layer, having a thickness of 30 nm and a carrier concentration $n=1\times10^{19}$ $cm^{-3}$, and an $In_{0.5}Ga_{0.5}As$ contact layer 1007 having a thickness of 20 nm and a carrier concentration $n=2\times10^{19}$ $cm^{-3}$.

After high-resistance ion implantation process for element isolation, the portion of InGaAs layers 1006 and 1007 other than the source region is removed by wet etching. At this time, as described before, the InGaP layer 1008 serves as an etching stopper layer. Thereafter, to form a drain electrode 1009, a 300 nm thick AuGe/Ni/Au layer is deposited by vacuum deposition and heat-treated at a predetermined temperature in a lamp anneal furnace, thereby forming an alloyed layer serving as the drain electrode 1009.

Subsequently, an opening having a T-shaped cross section is formed by using a multilayered resist in a portion where a gate electrode 1013 is to be formed. The portions of the InGaP layer 1008 and GaAs layer 1005 which are exposed through the opening are successively removed, thereby forming a recess structure.

Then, a 500 nm thick Ti/Pt/Au layer is deposited by vacuum deposition and a T-shaped gate electrode 1010 is formed by liftoff. The Ti/Pt/Au layer 1013 is formed on that portion of the surface of gate electrode 1010 which is not covered by the resist in this step.

A source electrode 1011 is formed so that an end on the gate electrode side is self-aligned with respect to a flange portion of the T-shaped gate electrode 1010, as shown in FIG. 10. Therefore, the distance between the source and gate electrodes is very small, the parasitic resistance, i.e., the source resistance, is suppressed to the minimum. Further, since the InGaAs layers 1007 and 1006 are removed from the drain side of the T-shaped gate electrode 1010, the distance between the flange portion and the semiconductor layer thereunder is relatively long. With this structure, the feedback capacitance in the flange portion of the T-shaped electrode is reduced as compared to the conventional transistor in which both the source and drain electrodes are formed on the same plane.

The diffusion preventing layer (diffusion stopper layer) used in the first to fourth embodiments can be used in the seventh to ninth embodiments. The alloy electrode can be brought into contact with the electron transit layer through the diffusion preventing layer. In this case also, the same advantage as that of the first to fourth embodiments can be obtained; that is, the parasitic resistance can be prevented, the breakdown voltage can be increased, and the feedback capacitance can be reduced, while maintaining the diffusion preventing effect.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor device including a field effect transistor, said transistor comprising:

a semi-insulating semiconductor substrate;

a channel forming layer arranged on or above said substrate;

a Schottky contact layer consisting essentially of a material selected from the group consisting of InGaP and InGaAs and arranged on or above said channel forming layer;

a gate electrode, consisting essentially of a metal comprising Ti, configured to form a Schottky contact with said Schottky contact layer; and a diffusion preventing layer, consisting essentially of AlAs and positioned between said channel forming layer and said gate electrode and in contact with said Schottky contact layer, configured to prevent said Ti of said gate electrode from diffusing into said channel forming layer.

2. The semiconductor device according to claim 1, further comprising an electron supplying layer, arranged between said channel forming layer and said Schottky contact layer, for supplying electrons to said channel forming layer.

3. The semiconductor device according to claim 1, further comprising:
- a pair of ohmic contact layers arranged on or above said Schottky contact layer so as to interpose said gate electrode; and
- source and drain electrodes constituting ohmic contacts with said ohmic contact layers.

4. The semiconductor device according to claim 1, wherein said Schottky contact layer comprises first and second layers, and said diffusion preventing layer is sandwiched between said first and second layers.

5. The semiconductor device according to claim 1, wherein said diffusion preventing layer is positioned between said Schottky contact layer and said gate electrode and has a thickness of several monolayers.

6. The semiconductor device according to claim 1, wherein said diffusion preventing layer has a coefficient of diffusion of Ti smaller than that of said Schottky contact layer.

7. The semiconductor device according to claim 1, wherein said channel forming layer and said Schottky contact layer are non-doped, and said pair of ohmic contact layers are doped with an n-type impurity.

8. A semiconductor device according to claim 1, wherein said channel forming layer and said Schottky contact layer are doped with an n-type impurity, and said pair of ohmic contact layers are doped with an n-type impurity.

9. A semiconductor device according to claim 1, wherein the diffusion preventing layer is in contact with said gate electrode.

10. The semiconductor device according to claim 1, wherein said gate electrode and said diffusion preventing layer face each other with at least part of said Schottky contact layer sandwiched therebetween.

11. A semiconductor device including a photo-semiconductor element, said photo-semiconductor element comprising:
- a supporting substrate;
- first and second current injection layers of first and second conductivity types arranged on or above said supporting substrate, said first current injection layer consisting essentially of AlGaN;
- an active layer comprising GaN and sandwiched between said first and second current injection layers;
- first and second contact layers of first and second conductivity types respectively connected to said first and second current injection layers, said first contact layer comprising GaN;
- first and second main electrodes, consisting essentially of metals, configured to form ohmic contact with said first and second contact layers, respectively, said first main electrode comprising Ti; and
- a first diffusion preventing layer, consisting essentially of AlN and positioned between said active layer and said first main electrode, configured to prevent said Ti of said first main electrode from diffusing into said active layer.

12. The semiconductor device according to claim 11, further comprising a second diffusion preventing layer, consisting essentially of AlN and positioned between said active layer and said second main electrode, configured to prevent said metal of said second main electrode from diffusing into said active layer.

13. The semiconductor device according to claim 11, wherein said first diffusion preventing layer is in contact with said first contact layer.

14. The semiconductor device according to claim 11, wherein said first diffusion preventing layer is in contact with said first current injection layer.

15. The semiconductor device according to claim 11, wherein said first main electrode and said first diffusion preventing layer face each other with at least part of said first contact layer sandwiched therebetween.

16. The semiconductor device according to claim 15, wherein said first contact layer comprises first and second layers, and said first diffusion preventing layer is sandwiched between said first and second layers.

17. The semiconductor device according to claim 15, wherein said first current injection layer comprises first and second layers, and said first diffusion preventing layer is sandwiched between said first and second layers.

18. A semiconductor device including a field effect transistor, said transistor comprising:
- a semi-insulating semiconductor substrate;
- a channel forming layer arranged on or above said substrate;
- a Schottky contact layer arranged on or above said channel forming layer;
- a gate electrode, consisting essentially of a metal, configured to form a Schottky contact with said Schottky contact layer;
- a diffusion preventing layer, positioned between said channel forming layer and said gate electrode and in contact with said Schottky contact layer, configured to prevent said metal of said gate electrode from diffusing into said channel forming layer; and
- source and drain electrodes connected to said channel forming layer, said source electrode being a non-alloy electrode comprising a refractory metal layer arranged on a semiconductor layer on or above said substrate, and said drain electrode comprising a drain metal layer and an alloyed layer obtained by alloying said drain metal layer and a semiconductor layer on or above said substrate,
- wherein said alloyed layer extends to said channel forming layer, and a distance between said drain metal layer and said gate electrode is not less than that between said drain metal layer and said channel forming layer.

19. A semiconductor device including a field effect transistor, said transistor comprising:
- a semi-insulating semiconductor substrate;
- a channel forming layer arranged on or above said substrate;
- a Schottky contact layer arranged on or above said channel forming layer;
- a gate electrode, consisting essentially of a metal, configured to form a Schottky contact with said Schottky contact layer;
- a diffusion preventing layer, positioned between said channel forming layer and said gate electrode and in contact with said Schottky contact layer, configured to prevent said metal of said gate electrode from diffusing into said channel forming layer; and
- source and drain electrodes connected to said channel forming layer, said source electrode being a non-alloy electrode comprising a refractory metal layer arranged on a semiconductor layer on or above said substrate, and said drain electrode comprising a drain metal layer and an alloyed layer obtained by alloying said drain metal layer and a semiconductor layer on or above said substrate, wherein a distance between said drain metal layer and said channel forming layer is smaller than that between said source metal layer and said channel forming layer.

20. A semiconductor device including a field effect transistor, said transistor comprising:

a semi-insulating semiconductor substrate;

a channel forming layer arranged on or above said substrate;

a Schottky contact layer arranged on or above said channel forming layer;

a gate electrode, consisting essentially of a metal, configured to form a Schottky contact with said Schottky contact layer; and a diffusion preventing layer positioned between said channel forming layer and said gate electrode and in contact with said Schottky contact layer and said gate electrode, configured to prevent said metal of said gate electrode from diffusing into said channel forming layer.

* * * * *